United States Patent
Zou et al.

(10) Patent No.: US 10,075,127 B1
(45) Date of Patent: Sep. 11, 2018

(54) PHOTOVOLTAIC RAPID SHUTDOWN DEVICE AND PHOTOVOLTAIC SYSTEM

(71) Applicant: SUNGROW POWER SUPPLY CO., LTD., Hefei Anhui (CN)

(72) Inventors: Yunfei Zou, Hefei Anhui (CN); Yanfei Yu, Hefei Anhui (CN); Hua Ni, Hefei Anhui (CN); Zongjun Yang, Hefei Anhui (CN); Liang Zhan, Hefei Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/901,392

(22) Filed: Feb. 21, 2018

(30) Foreign Application Priority Data

Feb. 28, 2017 (CN) .......................... 2017 1 0114498

(51) Int. Cl.
| | |
|---|---|
| *H02S 40/32* | (2014.01) |
| *H02H 7/20* | (2006.01) |
| *H01L 31/05* | (2014.01) |
| *H02H 9/02* | (2006.01) |
| *H01L 31/0443* | (2014.01) |

(52) U.S. Cl.
CPC .......... *H02S 40/32* (2014.12); *H01L 31/0443* (2014.12); *H01L 31/0504* (2013.01); *H02H 7/20* (2013.01); *H02H 9/02* (2013.01)

(58) Field of Classification Search
CPC . H02S 40/32; H01L 31/0443; H01L 31/0504; H02H 7/20; H02H 9/02
See application file for complete search history.

(56) References Cited

U.S. PATENT DOCUMENTS

| | | | |
|---|---|---|---|
| 2010/0139734 A1* | 6/2010 | Hadar | ............... H01L 31/02021 136/244 |
| 2012/0175961 A1 | 7/2012 | Har-Shai et al. | |
| 2013/0320767 A1 | 12/2013 | Huang et al. | |

FOREIGN PATENT DOCUMENTS

| | | |
|---|---|---|
| CN | 102163938 A | 8/2011 |
| CN | 102545148 A | 7/2012 |
| CN | 204031043 U | 12/2014 |

(Continued)

OTHER PUBLICATIONS

"National Electric Code," National Fire Protection Association, 2016, NFPA 70, pp. 1-881.

(Continued)

*Primary Examiner* — Daniel Cavallari
(74) *Attorney, Agent, or Firm* — Cantor Colburn LLP

(57) ABSTRACT

A photovoltaic rapid shutdown device and a photovoltaic system are provided. The device includes a first switch, a second switch, a bypass diode, an auxiliary power supply, a control circuit and a communication circuit. One of multiple photovoltaic modules serves as a power supplying photovoltaic module, and an output terminal of the power supplying photovoltaic module is connected to an input terminal of the auxiliary power supply. The first switch is connected in series between the power supplying photovoltaic module and an adjacent photovoltaic module. Two terminals of the second switch are connected to positive and negative output terminals of a branch formed by the multiple photovoltaic modules connected in series, respectively. A cathode of the bypass diode is connected to a low voltage terminal of the adjacent photovoltaic module.

15 Claims, 16 Drawing Sheets

(56) References Cited

FOREIGN PATENT DOCUMENTS

CN   205584119 U    9/2016
TW   201349731 A   12/2013

OTHER PUBLICATIONS

National Electrical Code, 2017 Edition: Article 344—Rigid Metal Conduit: Type RMC, 200 pages.
National Electrical Code, 2017 Edition: Article 514—Motor Fuel Dispensing Facilities, 200 pages.
National Electrical Code, 2017 Edition: Article 706—Energy Storage Systems, 281 pages.
Summary of First SIPO Office Action corresponding to Application No. 201710114498.8; dated Apr. 2, 2018.

* cited by examiner

US 10,075,127 B1

PHOTOVOLTAIC RAPID SHUTDOWN DEVICE AND PHOTOVOLTAIC SYSTEM

CROSS REFERENCE TO RELATED APPLICATION

The present application claims the priority to Chinese Patent Application No. 201710114498.8, filed on Feb. 28, 2017, the entire content of which is incorporated herein by reference.

FIELD

The present disclosure relates to the technical field of photovoltaic power generation, and in particular to a photovoltaic rapid shutdown device and a photovoltaic system.

BACKGROUND

The photovoltaic power generation technology, as a renewable energy source power generation technology, has been widely used all over the world. The direct current outputted from a photovoltaic array is converted into the alternating current by an inverter, and thus the alternating current, as the clean energy source, is transmitted to a power grid. With the development of the photovoltaic industry, the probability that an accident occurs during the operation is increasing.

Since the photovoltaic array formed by multiple photovoltaic modules connected in series with each other has a high voltage, a rapid shutdown (RS) mechanism is put forward for a photovoltaic system in the National Electrical Code (NEC) 2017, 690.12, to improve the safety of the photovoltaic system. It is required that, a voltage between conductors within a range of one foot and a voltage between a conductor and the ground cannot exceed 80V after the shutdown protection is performed on the photovoltaic array.

The existing major methods are described as follows.

A module shutdown technology is generally used. In which, each of modules is connected to a rapid shutdown device, and the module is connected in series with a switch included in the shutdown device. In the normal operation, the switch is turned on, and the module may output electric energy. When a shutdown instruction is received, the rapid shutdown device controls the switch to be turned off, so that the modules are open-circuited relative to each other, and the output voltage is zero.

For the protection method in which a module is connected to a rapid shutdown device, each photovoltaic module is required to be connected to one rapid shutdown device, which results in a high cost. In addition, in the normal power generation process, switches of multiple rapid shutdown devices corresponding to a photovoltaic string may be connected in series with each other, which results in a large conduction loss and low power generation efficiency.

SUMMARY

In order to solve the above technical problems in the conventional technology, a photovoltaic rapid shutdown device and a photovoltaic system are provided in the present disclosure. With the photovoltaic rapid shutdown device and the photovoltaic system, the cost can be reduced, the energy consumption can be decreased, and the power generation efficiency can be improved.

There is provided a photovoltaic rapid shutdown device applied to a photovoltaic system according to an embodiment of the present disclosure, where the photovoltaic system includes multiple photovoltaic modules connected in series with each other.

The photovoltaic rapid shutdown device includes a first switch, a second switch, a bypass diode, an auxiliary power supply, a control circuit and a communication circuit, where one of the multiple photovoltaic modules serves as a power supplying photovoltaic module, and an output terminal of the power supplying photovoltaic module is connected to an input terminal of the auxiliary power supply;

the first switch is connected in series between the power supplying photovoltaic module and an adjacent photovoltaic module of the power supplying photovoltaic module;

two terminals of the second switch are connected to a positive output terminal and a negative output terminal of a branch formed by the multiple photovoltaic modules connected in series with each other, respectively;

a cathode of the bypass diode is connected to a low voltage terminal of the adjacent photovoltaic module of the power supplying photovoltaic module, and an anode of the bypass diode is connected to a low voltage terminal of the power supplying photovoltaic module;

the communication circuit is configured to receive a shutdown instruction transmitted from outside and transmit the shutdown instruction to the control circuit; and the control circuit is configured to control the first switch to be turned off and the second switch to be turned on when receiving the shutdown instruction.

Preferably, the rapid shutdown device may further include a current limiting resistor and a third switch, where the current limiting resistor is connected in series with the third switch to form a branch, and the branch is connected in parallel with the second switch; and the control circuit is configured to firstly control the first switch to be turned off and the third switch to be turned on when receiving the shutdown instruction, and then control the second switch to be turned on when detecting that a bus voltage reduces to a voltage lower than a predetermined voltage.

Preferably, the rapid shutdown device may further include a current limiting resistor and a third switch, where the current limiting resistor is connected in series with the second switch;

the third switch is connected in parallel with the current limiting resistor; and the control circuit is configured to firstly control the first switch to be turned off and the second switch to be turned on when receiving the shutdown instruction, and then control the third switch to be turned on when detecting that a bus voltage reduces to a voltage lower than a predetermined voltage.

There is provided a photovoltaic rapid shutdown device applied to a photovoltaic system according to another embodiment of the present disclosure, where the photovoltaic system includes multiple photovoltaic modules connected in series with each other.

The photovoltaic rapid shutdown device includes a first switch, one or more second switches, a bypass diode, an auxiliary power supply, a control circuit and a communication circuit, where one of the multiple photovoltaic modules serves as a power supplying photovoltaic module, and an output terminal of the power supplying photovoltaic module is connected to an input terminal of the auxiliary power supply;

the first switch is connected in series between the power supplying photovoltaic module and an adjacent photovoltaic module of the power supplying photovoltaic module;

in the case of one second switch, the second switch is connected between a positive output terminal and a negative output terminal of a branch formed by photovoltaic modules among the multiple photovoltaic modules other than the power supplying photovoltaic module connected in series with each other;

in the case of more than one second switch, each of the second switches corresponds to one or more photovoltaic modules among the multiple photovoltaic modules other than the power supplying photovoltaic module, and each of the second switches is connected in parallel with an output terminal of the corresponding photovoltaic module;

a cathode of the bypass diode is connected to a low voltage terminal of the adjacent photovoltaic module of the power supplying photovoltaic module, and an anode of the bypass diode is connected to a low voltage terminal of the power supplying photovoltaic module;

the communication circuit is configured to receive a shutdown instruction transmitted from outside and transmit the shutdown instruction to the control circuit; and the control circuit is configured to control the first switch to be turned off and the second switch to be turned on when receiving the shutdown instruction.

There is provided a photovoltaic rapid shutdown device applied to a photovoltaic system according to another embodiment of the present disclosure, where the photovoltaic system includes multiple photovoltaic modules connected in series with each other.

The photovoltaic rapid shutdown device includes a first switch, a second switch, a first bypass diode, a second bypass diode, an auxiliary power supply, a control circuit, a communication circuit and one or more short circuit switches, where the multiple photovoltaic modules include a first power supplying photovoltaic module and a second power supplying photovoltaic module;

the first switch is connected in series between the first power supplying photovoltaic module and an adjacent photovoltaic module of the first power supplying photovoltaic module;

the second switch is connected in series between the second power supplying photovoltaic module and an adjacent photovoltaic module of the second power supplying photovoltaic module;

each of the short circuit switches corresponds to one or more of photovoltaic modules among the multiple photovoltaic modules other than the first and second power supplying photovoltaic modules, and each of the open circuit switches is connected in parallel with an output terminal of the corresponding photovoltaic module;

a cathode of the first bypass diode is connected to a low voltage terminal of the adjacent photovoltaic module of the first power supplying photovoltaic module, an anode of the first bypass diode is connected to a low voltage terminal of the first power supplying photovoltaic module, a cathode of the second bypass diode is connected to a low voltage terminal of the adjacent photovoltaic module of the second power supplying photovoltaic module, and an anode of the second bypass diode is connected to a low voltage terminal of the second power supplying photovoltaic module;

the communication circuit is configured to receive a shutdown instruction transmitted from outside and transmit the shutdown instruction to the control circuit; and the control circuit is configured to control the first switch to be turned off, the second switch to be turned off, and all of the short circuit switches to be turned on when receiving the shutdown instruction.

Preferably, the rapid shutdown device may further include a first power supplying diode and a second power supplying diode, where an anode of the first power supplying diode is connected to a high voltage terminal of the first power supplying photovoltaic module, and a cathode of the first power supplying diode is connected to the input terminal of the auxiliary power supply; and an anode of the second power supplying diode is connected to a high voltage terminal of the second power supplying photovoltaic module, and a cathode of the second power supplying diode is connected to the input terminal of the auxiliary power supply.

Preferably, the first switch, the second switch and the open circuit switch each may be any one of:

a triode, a Metal Oxide Semiconductor (MOS) transistor, an Insulated Gate bipolar Transistor (IGBT) or a relay.

A photovoltaic system is further provided according to an embodiment of the present disclosure, which includes the photovoltaic rapid shutdown device described above, an inverter and multiple photovoltaic modules, where the photovoltaic rapid shutdown device includes at least two input ports;

one of the multiple photovoltaic modules, which supplies power to the photovoltaic rapid shutdown device, serves as a power supplying photovoltaic module, where an output terminal of the power supplying photovoltaic module is connected to one of the at least two input ports, and other photovoltaic modules are connected to other input ports;

an output port of the photovoltaic rapid shutdown device is connected to an input terminal of the inverter;

the inverter is configured to transmit a control signal to the photovoltaic rapid shutdown device; and the photovoltaic rapid shutdown device is configured to shut down the photovoltaic module when receiving the control signal.

A photovoltaic system is provided according to another embodiment of the present disclosure, which includes photovoltaic rapid shutdown devices described above and an inverter, where the number of the photovoltaic rapid shutdown devices is at least two;

an input terminal of each of the photovoltaic rapid shutdown devices is connected to the photovoltaic module, and output terminals of all of the photovoltaic rapid shutdown devices are connected in series with each other to be connected to an input terminal of the inverter;

the inverter is configured to transmit a control signal to the photovoltaic rapid shutdown device; and the photovoltaic rapid shutdown device is configured to shut down the corresponding photovoltaic module when receiving the control signal.

Preferably, the photovoltaic system may further include:

a combiner box connected between the photovoltaic rapid shutdown device and the inverter;

and/or, a transformer connected between the inverter and a power grid.

Compared with the conventional technology, the present disclosure has at least the following advantages.

Since only one rapid shutdown device is used to control the shutdown of all of the photovoltaic modules in the present disclosure, while each of the photovoltaic modules corresponds to one shutdown device in the conventional technology, the number of switches included in the photovoltaic rapid shutdown device according to the present disclosure is reduced as compared with the conventional technology, and thus the energy consumed by the switches during the normal operation of the photovoltaic modules is reduced to a certain extent. With the photovoltaic rapid shutdown device according to the present disclosure, the cost is reduced, and power is supplied to the photovoltaic rapid shutdown device by one photovoltaic module. In addition, since the photovoltaic rapid shutdown device according to the embodiment of the present disclosure includes at least one short circuit switch, and no current flows through the short circuit switch during the normal operation of the photovoltaic modules, no energy is consumed by the short circuit switch.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described hereinafter. It is apparent that, the drawings in the following description show only some embodiments of the present disclosure, and other drawings may be obtained by those skilled in the art from the drawings without creative efforts.

DETAILED DESCRIPTION OF EMBODIMENTS

In order to make technical solutions of the present disclosure be better understood by those skilled in the art, technical solutions in embodiments of the present disclosure are clearly and completely described in conjunction with drawings in the embodiments of the present disclosure. It is apparent that embodiments described below are only a part rather than all of the embodiments of the present disclosure. All other embodiments obtained by those skilled in the art based on the embodiments in the present disclosure without creative efforts fall within the protection scope of the present disclosure.

Figure 1:
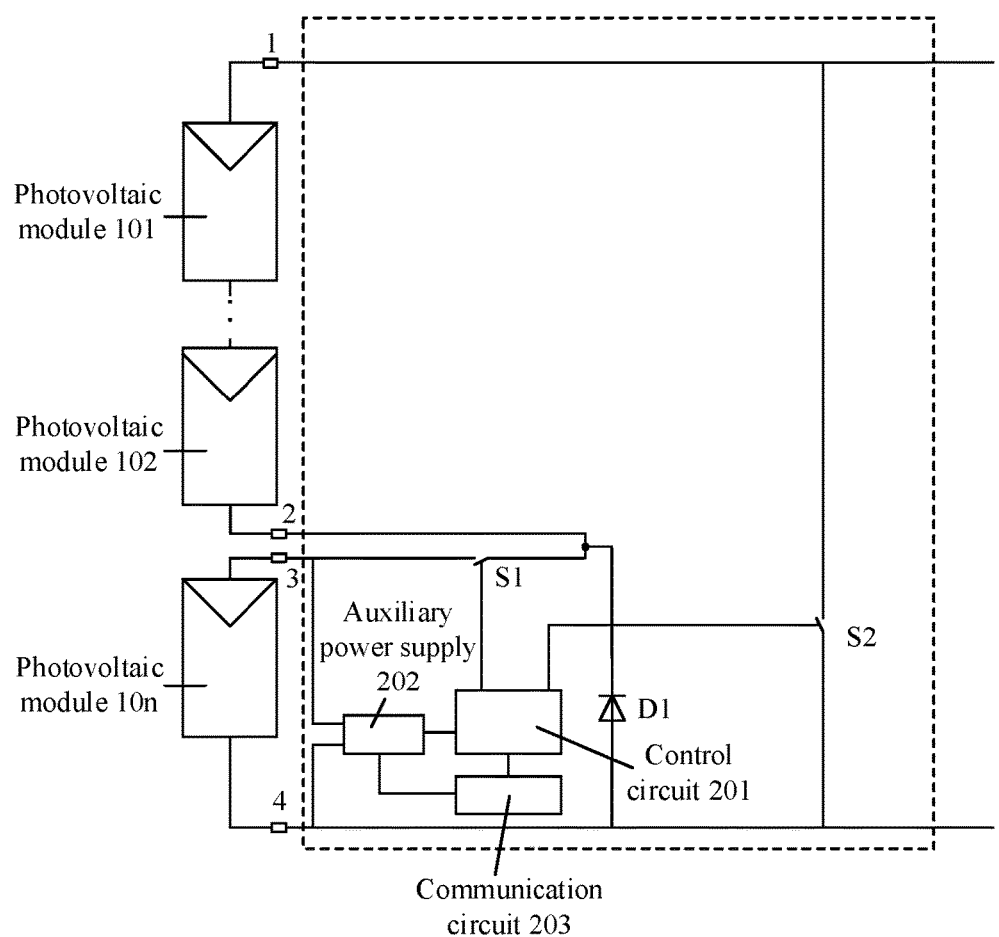
FIG. 1 is a schematic diagram of a photovoltaic rapid shutdown device according to a first embodiment of the present disclosure.

Reference is made to FIG. 1, which is a schematic diagram of a photovoltaic rapid shutdown device according to a first embodiment of the present disclosure.

The photovoltaic rapid shutdown device according to the present embodiment is applied to a photovoltaic system. The photovoltaic system includes multiple photovoltaic modules connected in series with each other, such as photovoltaic modules 101 to 10$n$ shown in FIG. 1.

The photovoltaic rapid shutdown device includes a first switch S1, a second switch S2, a bypass diode D1, a control circuit 201, an auxiliary power supply 202 and a communication circuit 203.

One of the multiple photovoltaic modules serves as a power supplying photovoltaic module, and an output terminal of the power supplying photovoltaic module is connected to an input terminal of the auxiliary power supply 202.

In the present embodiment, the following description is made by assuming that the photovoltaic module 10$n$ serves as the power supplying photovoltaic module. It should be understood that any one of the photovoltaic modules may serve as the power supplying photovoltaic module, which is not limited in the present disclosure.

The first switch S1 is connected in series between the power supplying photovoltaic module 10$n$ and an adjacent photovoltaic module of the power supplying photovoltaic module 10$n$. As shown in FIG. 1, a photovoltaic module 102 is adjacent to the power supplying photovoltaic module 10$n$.

Two terminals of the second switch S2 are connected to a positive output terminal and a negative output terminal of a branch formed by the multiple photovoltaic modules in connected series with each other, respectively. The second switch S2 is connected in parallel with an output terminal of the branch formed by the multiple photovoltaic modules connected in series with each other. When the second switch S2 is turned on, the output terminal of the branch formed by the multiple photovoltaic modules connected in series with each other is short-circuited, and a bus voltage reduces to zero.

A cathode of the bypass diode D1 is connected to a low voltage terminal of the adjacent photovoltaic module 102 of the power supplying photovoltaic module 10$n$, and an anode of the bypass diode D1 is connected to a low voltage terminal of the power supplying photovoltaic module 10$n$.

The communication circuit 203 is configured to receive a shutdown instruction transmitted from outside and transmit the shutdown instruction to the control circuit 201.

It should be noted that the communication circuit 203 generally receives a shutdown instruction transmitted from a starter or an inverter.

The control circuit 201 is configured to control the first switch S1 to be turned off and the second switch S2 to be turned on when receiving the shutdown instruction.

The first switch S1 serves as an open circuit switch, and the second switch S2 serves as a short circuit switch.

In the normal operation, the first switch S1 is turned on, the second switch S2 is turned off, and all of the photovoltaic modules are connected in series with each other to generate power.

When the communication circuit 203 receives a shutdown instruction, the control circuit 201 firstly controls the first switch S1 to be turned off, so that the power supplying photovoltaic module 10n is open-circuited, and power is supplied to only the auxiliary power supply 202. In addition, if the photovoltaic modules 101 to 102 still output currents, the bypass diode D1 is turned on. If the photovoltaic modules 101 to 102 output no current, the bypass diode D1 is in a reverse cut-off state. The control circuit 201 then controls the second switch S2 to be turned on, so that the photovoltaic modules 101 to 102 are short-circuited, and the bus voltage reduces to zero, thereby realizing a rapid shutdown function.

In the photovoltaic rapid shutdown device according to the present embodiment, since only one rapid shutdown device is used to control the shutdown of all of the photovoltaic modules, while each of the photovoltaic modules corresponds to one shutdown device in the conventional technology, the number of switches included in the photovoltaic rapid shutdown device according to the embodiment is reduced as compared with the conventional technology, and the energy consumed by the switches during the normal operation of the photovoltaic modules is reduced to a certain extent. With the photovoltaic rapid shutdown device according to the present disclosure, the cost is reduced, and power is supplied to the photovoltaic rapid shutdown device by one of the photovoltaic modules. In addition, since the photovoltaic rapid shutdown device according to the embodiment of the present disclosure includes at least one short circuit switch, and no current flows through the short circuit switch during the normal operation of the photovoltaic modules, no energy is consumed by the short circuit switch.

It should be noted that the part illustrated by dashed boxes in each of the drawings corresponding to all the embodiments of the present disclosure represents the photovoltaic rapid shutdown device.

When the short circuit switch is turned on, a bus capacitor may discharge, and the short-circuited branch withstands a large discharge current. Therefore, a current limiting resistor may be added to the current photovoltaic rapid shutdown device to avoid an impact of the discharge current at the moment of short-circuiting. Two current limiting methods are described below in conjunction with FIG. 2 and FIG. 3, respectively.

Figure 2:
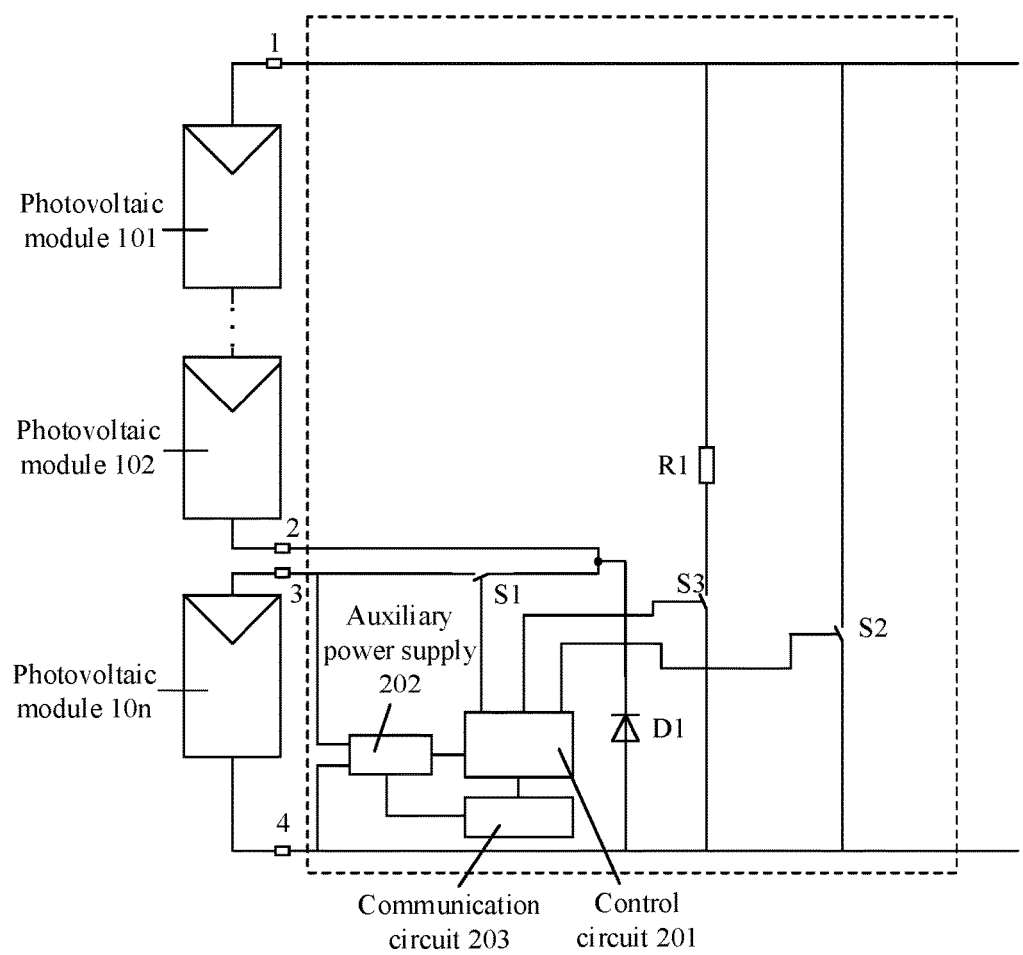
FIG. 2 is a schematic diagram of a photovoltaic rapid shutdown device according to a second embodiment of the present disclosure.

Reference is made to FIG. 2, which is a schematic diagram of a photovoltaic rapid shutdown device according to a second embodiment of the present disclosure.

The photovoltaic rapid shutdown device according to the present embodiment further includes a current limiting resistor R1 and a third switch S3.

The current limiting resistor R1 is connected in series with the third switch S3 to form a branch, and the branch is connected in parallel with the second switch S2.

The control circuit 201 is configured to firstly control the first switch S1 to be turned off and the third switch S3 to be turned on when receiving the shutdown instruction, and then control the second switch S2 to be turned on when detecting that the bus voltage reduces to a voltage lower than a predetermined voltage.

In the normal operation, the first switch S1 is turned on, the second switch S2 and the third switch S3 are turned off, and all of the photovoltaic modules are connected in series with each other to generate power. When a fault occurs or a shutdown signal is received, the bus voltage is required to be reduced. In this case, the control circuit firstly controls the first switch S1 to be turned off, so that the photovoltaic module 10n is open-circuited, the bypass diode D1 is turned on, and the auxiliary power supply 202 may stably supply power to other circuits due to the presence of an open-circuit voltage. The control circuit 201 then controls the third switch S3 to be turned on, so that the bus capacitor discharges via the current limiting resistor R1, and the discharge current cannot be too large due to the presence of the current limiting resistor R1, thereby avoiding the impact of the too large discharge current. When the bus voltage reduces to a certain level, the control circuit 201 controls the second switch S2 to be turned on, so that the series branch of the photovoltaic modules 101 to 102 is short-circuited and cannot output electrical energy, and the bus voltage reduces to zero, thereby protecting the whole photovoltaic string.

A resistance of the current limiting resistor R1 may be set according to requirements, which is not limited in the embodiment.

Figure 3:
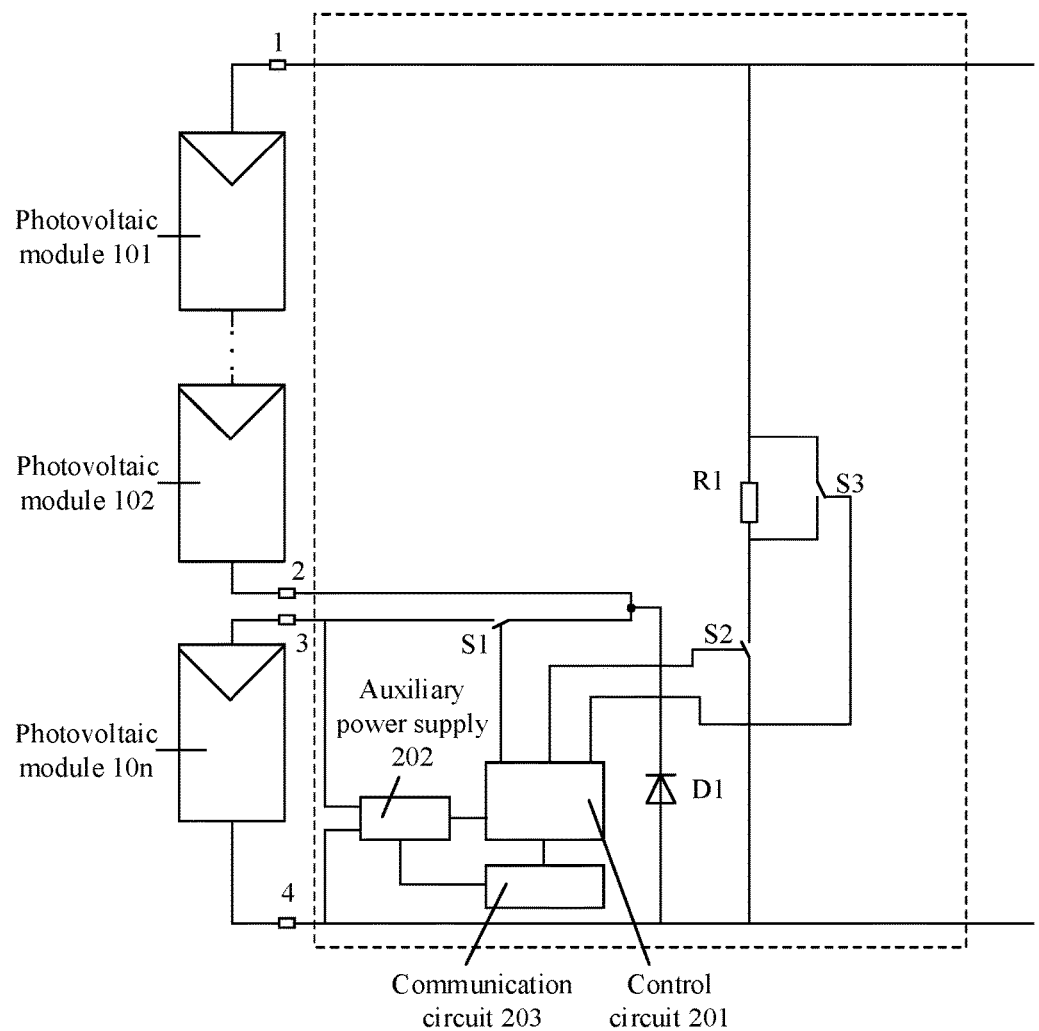
FIG. 3 is a schematic diagram of a photovoltaic rapid shutdown device according to a third embodiment of the present disclosure.

Reference is made to FIG. 3, which is a schematic diagram of a photovoltaic rapid shutdown device according to a third embodiment of the present disclosure.

The photovoltaic rapid shutdown device according to the present embodiment further includes a current limiting resistor R1 and a third switch S3.

The current limiting resistor R1 is connected in series with the second switch S2;

The third switch S3 is connected in parallel with the current limiting resistor R1.

The control circuit 201 is configured to firstly control the first switch S1 to be turned off and control the second switch S2 to be turned on when receiving the shutdown instruction, and then control the third switch S3 to be turned on when detecting that the bus voltage reduces to a voltage lower than a predetermined voltage.

In the normal operation, the first switch S1 is turned on, the second switch S2 is turned off, and all of the photovoltaic modules are connected in series with each other to generate power. When a fault occurs or a shutdown signal is received, the control circuit 201 firstly controls the first switch S1 to be turned off, so that the power supplying photovoltaic module 10n is open-circuited, the bypass diode D1 is turned on, and the auxiliary power supply 202 may stably supply power to other circuits due to the presence of an open-circuit voltage. The control circuit 201 then controls the second switch S2 to be turned on, so that the current is limited by the current limiting resistor R1. When the bus voltage reduces to a certain level, the control circuit 201 controls the third switch S3 to be turned on, so that the current limiting resistor R1 is short-circuited, and the photovoltaic modules 101 to 102 are short-circuited, thereby realizing the shutdown protection.

Each of the photovoltaic rapid shutdown devices shown in FIG. 1 to FIG. 3 includes two input ports. That is, a power supplying photovoltaic module is connected to one of the input ports, and non-power supplying photovoltaic modules are connected to the other input port. An implementation of a photovoltaic rapid shutdown device including two input ports is further described below. Reference is made to FIG.

4, which is a schematic diagram of a photovoltaic rapid shutdown device according to a fourth embodiment of the present disclosure. The embodiment shown in FIG. 4 differs from the embodiment shown in FIG. 1 in the connection relation of a short circuit switch.

The photovoltaic rapid shutdown device according to the present embodiment is applied to a photovoltaic system including multiple photovoltaic modules connected in series with each other.

The photovoltaic rapid shutdown device includes a first switch S1, one or more second switches S2, a bypass diode D1, a control circuit 201, an auxiliary power supply 202 and a communication circuit 203.

One of the multiple photovoltaic modules, such as a photovoltaic module 10$n$, serves as the power supplying photovoltaic module, and an output terminal of the power supplying photovoltaic module 10$n$ is connected to an input terminal of the auxiliary power supply 202.

The first switch S1 is connected in series between the power supplying photovoltaic module 10$n$ and an adjacent photovoltaic module of the power supplying photovoltaic module 10$n$.

Same parts of the present embodiment as the embodiment in FIG. 1 are not repeated herein, and only different parts are described. In the case of one second switch S2, the second switch S2 is connected between a positive output terminal and a negative output terminal of a branch formed by photovoltaic modules (101 to 102) other than the power supplying photovoltaic module 10$n$ connected in series with each other.

A cathode of the bypass diode D1 is connected to a low voltage terminal of the adjacent photovoltaic module of the power supplying photovoltaic module 10$n$, and an anode of the bypass diode D1 is connected to a low voltage terminal of the power supplying photovoltaic module 10$n$.

The communication circuit 203 is configured to receive a shutdown instruction transmitted from outside and transmit the shutdown instruction to the control circuit.

The control circuit 201 is configured to control the first switch to be turned off and the second switch to be turned on when receiving the shutdown instruction.

In the normal operation, the first switch S1 is turned on, the second switch S2 is turned off, and all of the photovoltaic modules are connected in series with each other to generate power. When a fault occurs or a shutdown signal is received, the control circuit 201 firstly controls the first switch S1 to be turned off, so that the power supplying photovoltaic module 10$n$ is open-circuited, the bypass diode D1 is turned on, and the auxiliary power supply 202 may stably supply power to other circuits due to the presence of an open-circuit voltage. The control circuit 201 then controls the second switch S2 to be turned on, so that the series branch of the photovoltaic modules 101 to 102 is short-circuited, and the bus voltage reduces to zero, thereby protecting the whole photovoltaic string.

An implementation of a photovoltaic rapid shutdown device including two or more input ports is described below.

Figure 5:
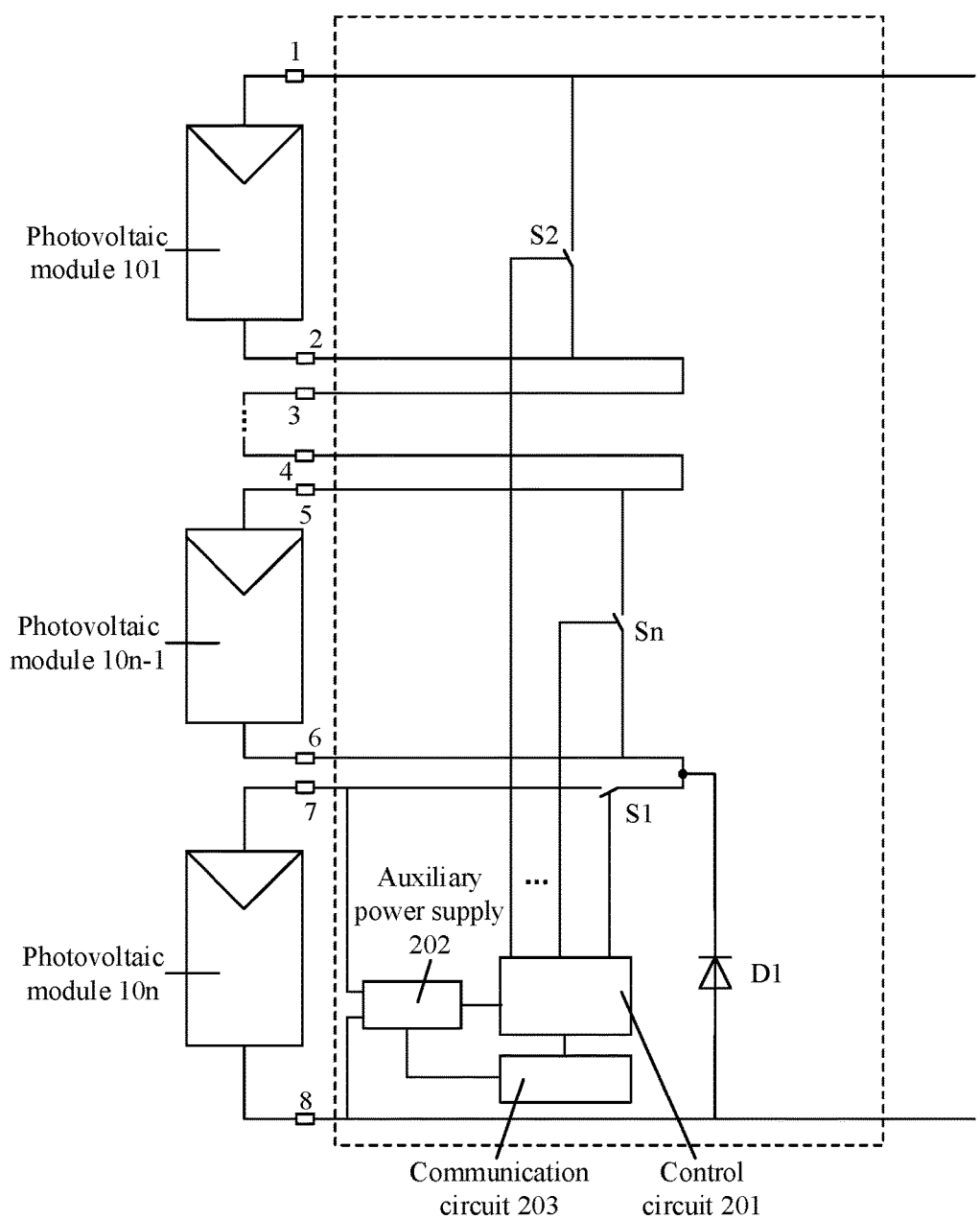
FIG. 5 is a schematic diagram of a photovoltaic rapid shutdown device according to a fifth embodiment of the present disclosure.

Reference is made to FIG. 5, which is a schematic diagram of a photovoltaic rapid shutdown device according to a fifth embodiment of the present disclosure.

In the present embodiment, the power supplying photovoltaic module corresponds to an open circuit switch, and other photovoltaic modules correspond to short circuit switches. In addition, one short circuit switch may correspond to one photovoltaic module, or one short circuit switch may correspond to multiple photovoltaic modules. For example, one short circuit switch may correspond to two photovoltaic modules or three photovoltaic modules. In the case that one short circuit switch corresponds to two photovoltaic modules, the short circuit switch is connected in parallel with an output terminal of a branch formed by the two photovoltaic modules connected in series with each other.

The photovoltaic rapid shutdown device according to the present embodiment includes two or more input ports. Each input port is connected to one or more photovoltaic modules.

In the embodiment shown by FIG. 5, the following description is made by assuming that each of photovoltaic modules other than the power supplying photovoltaic module corresponds to one short circuit switch. For example, a photovoltaic module 101 corresponds to one input port and corresponds to one short circuit switch S2. Similarly, a photovoltaic module 10$n$-1 corresponds to one input port and corresponds to one short circuit switch Sn.

In the normal operation, the first switch S1 is turned on, the short circuit switches S2 to Sn are turned off, and the photovoltaic modules are connected in series with each other to generate power.

When the communication circuit 203 receives a shutdown instruction, the control circuit 201 firstly controls the first switch S1 to be turned off, so that the power supplying photovoltaic module 10$n$ is open-circuited, and power is supplied to only the auxiliary power supply 202. In addition, if the photovoltaic module 101 still outputs a current, the bypass diode D1 is turned on. The control circuit 201 then controls the short circuit switches (S2 to Sn) to be turned on, so that the photovoltaic modules 101 to 10$n$-1 each are short-circuited, and the bus voltage reduces to zero, thereby realizing a rapid shutdown function.

In the photovoltaic rapid shutdown device according to the present embodiment, the power supplying photovoltaic module corresponds to the open circuit switch, and other photovoltaic modules correspond to the short circuit switches. In the normal operation, no current flows through the short circuit switches, therefore, the power consumption of the whole photovoltaic system can be reduced.

In addition, it should be understood that, in the case of two or more input ports, the photovoltaic rapid shutdown device may further include multiple open circuit switches and at least one short circuit switch, other than the implementation in FIG. 5. The detailed description is made below in conjunction with FIG. 6.

Figure 6:
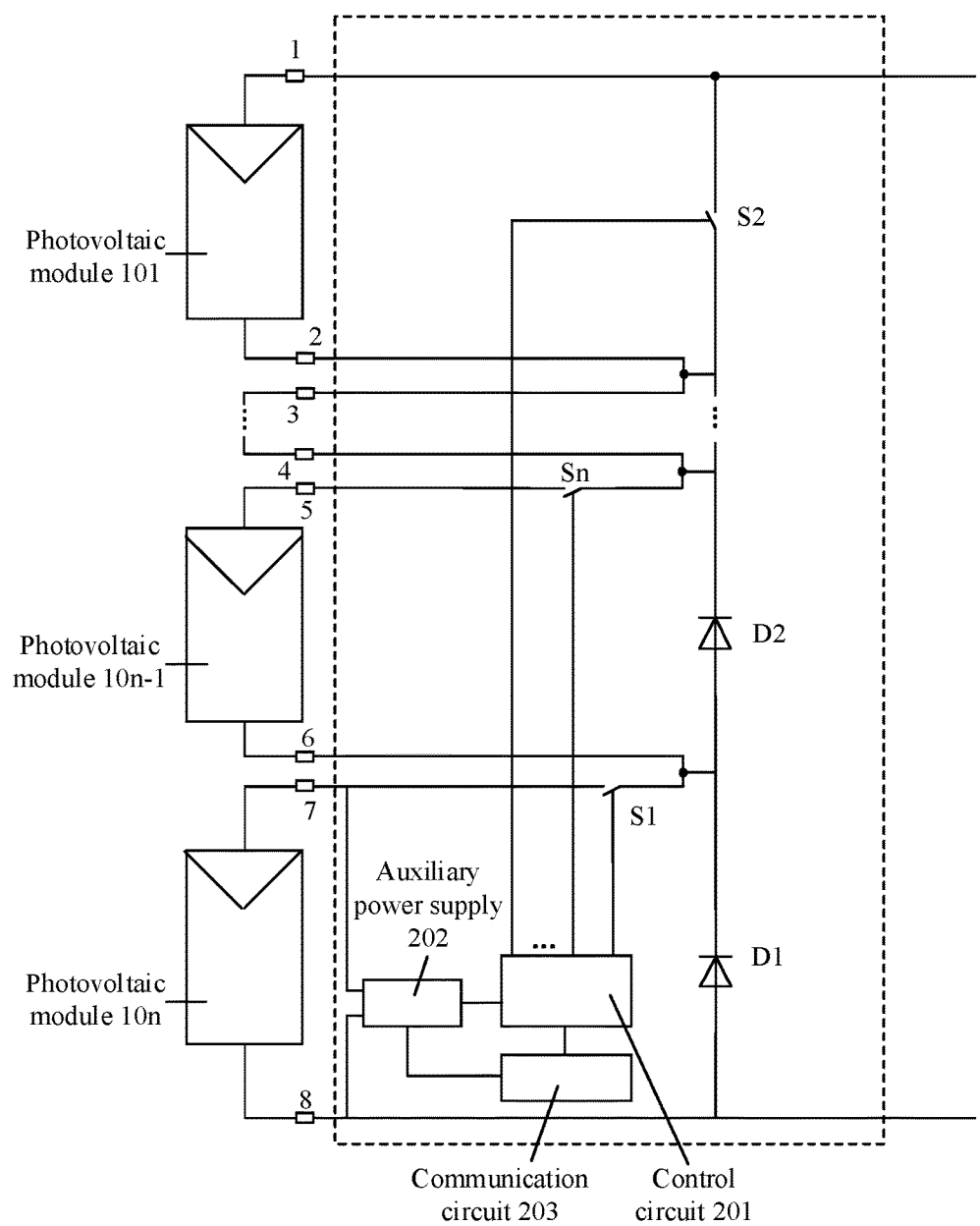
FIG. 6 is a schematic diagram of a photovoltaic rapid shutdown device according to a sixth embodiment of the present disclosure.

Reference is made to FIG. 6, which is a schematic diagram of a photovoltaic rapid shutdown device according to a sixth embodiment of the present disclosure.

In the embodiment shown by FIG. 6, a photovoltaic module 101 corresponds to a short circuit switch S2, and other photovoltaic modules each correspond to open circuit switches.

It should be understood that, a power supplying photovoltaic module may correspond to an open circuit switch, and multiple photovoltaic modules among other photovoltaic modules may correspond to short circuit switches. For example, two or three photovoltaic modules correspond to short circuit switches.

It should be noted that the photovoltaic rapid shutdown device according to the present embodiment includes at least one short circuit switch. During the normal operation of the photovoltaic system, no current flows through the short circuit switch. Therefore, the system power consumption can be saved with the device according to the present disclosure as compared with a solution that all the switches are open circuit switches in the conventional technology.

It should be noted that an output terminal of a photovoltaic module corresponding to an open circuit switch is connected in reverse parallel with a diode, such as D1 and D2 shown in FIG. 6.

In the normal operation, open circuit switches Sn−1 and S1 are turned on, a short circuit switch S2 is turned off, and the photovoltaic modules are connected in series with each other to generate power. When the communication circuit 203 receives a shutdown instruction, the control circuit 201 firstly controls the open circuit switches Sn−1 and S1 to be turned off, so that the power supplying photovoltaic module 10n is open-circuited, power is supplied to only the auxiliary power supply 202, and the bypass diode D1 is turned on. The control circuit 201 then controls other open circuit switches to be turned off, so that the corresponding photovoltaic module is open-circuited, and the bus voltage reduces to zero, thereby realizing a rapid shutdown function.

The case that power is supplied to the auxiliary power supply by one photovoltaic module has been described in the above embodiment, and the case that power is supplied to the auxiliary power supply by two photovoltaic modules is described below.

Figure 7:
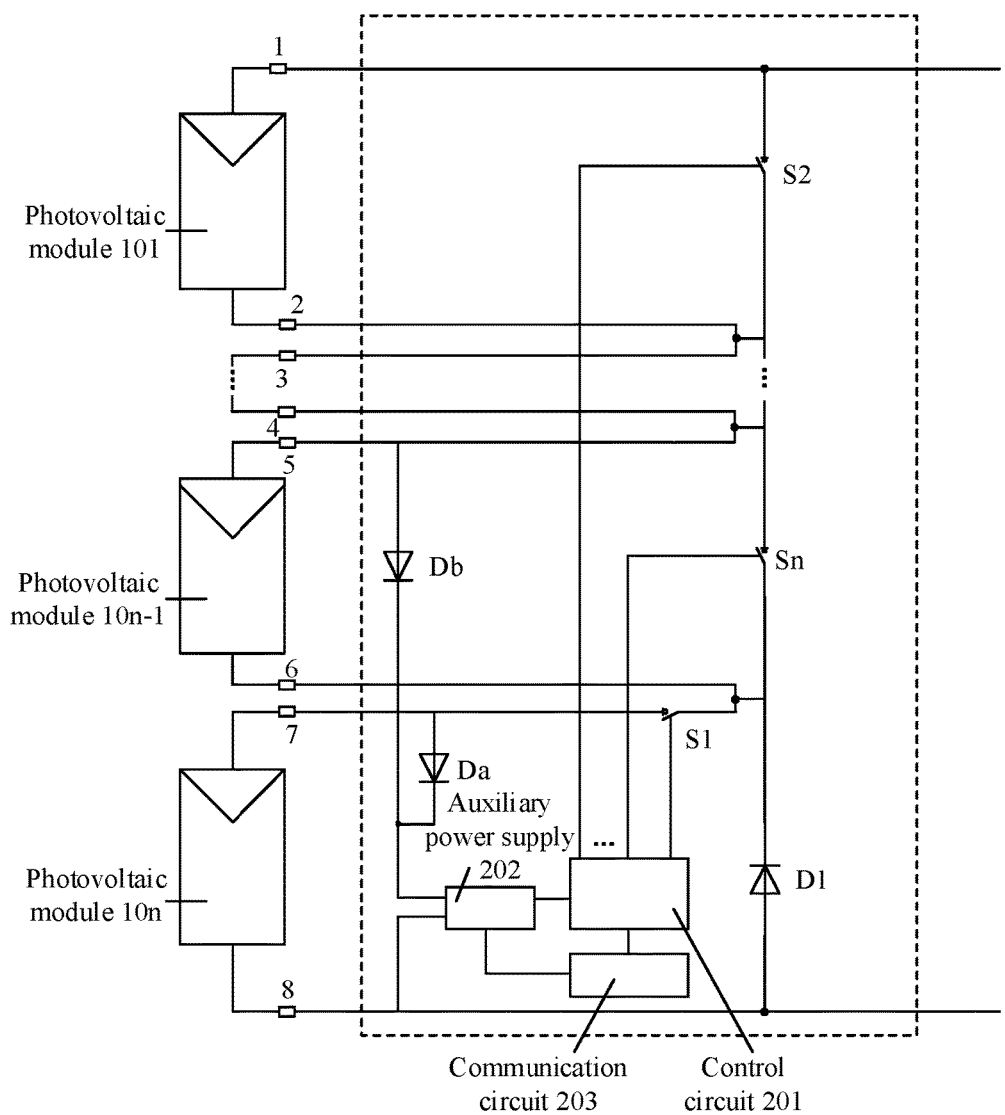
FIG. 7 is a schematic diagram of a photovoltaic rapid shutdown device according to a seventh embodiment of the present disclosure.

Reference is made to FIG. 7, which is a schematic diagram of a photovoltaic rapid shutdown device according to a seventh embodiment of the present disclosure.

The photovoltaic rapid shutdown device according to the present embodiment further includes a first power supplying diode Da and a second power supplying diode Db.

An anode of the first power supplying diode Da is connected to a high voltage terminal of the power supplying photovoltaic module 10n, and a cathode of the first power supplying diode Da is connected to the input terminal of the auxiliary power supply 202.

An anode of the second power supplying diode Db is connected to a high voltage terminal of the power supplying photovoltaic module 10n, and a cathode of the second power supplying diode Db is connected to the input terminal of the auxiliary power supply 202.

In the normal operation, the power supplying photovoltaic module 10n is connected in series with the power supplying photovoltaic module 10n−1 to supply power to the auxiliary power supply 202, thereby realizing redundancy power supplying.

Figure 8:
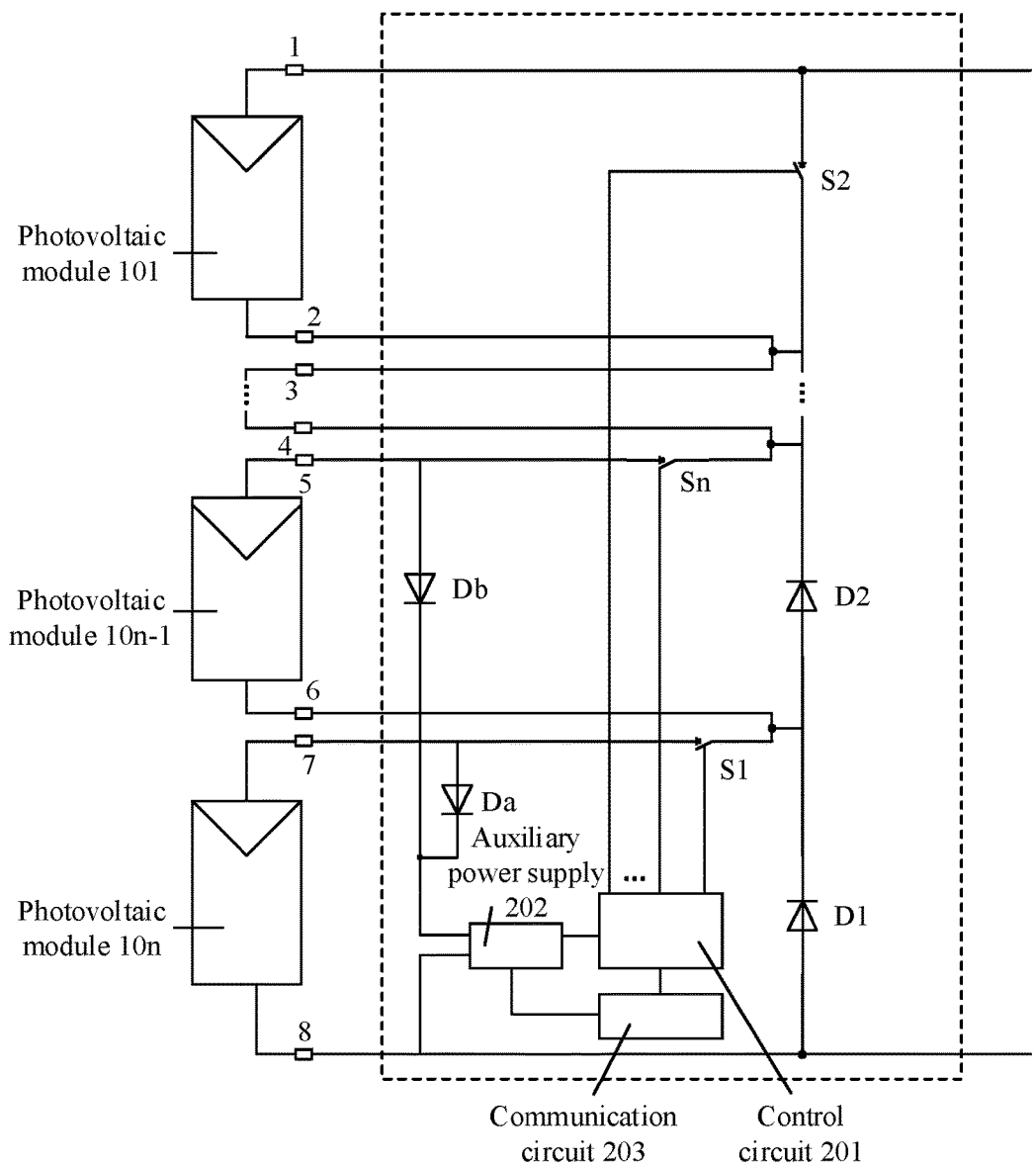
FIG. 8 is a schematic diagram showing redundancy power supplying according to an embodiment of the present disclosure.

However, as shown in FIG. 7, the power supplying photovoltaic module 10n−1 corresponds to a short circuit switch Sn−1 and cannot supply power to the auxiliary power supply when the short circuit switch Sn−1 is turned on, therefore, the switch corresponding to the power supplying photovoltaic module 10n−1 may be replaced with an open circuit switch similar to the S1. As shown in FIG. 8, when the photovoltaic modules are shut down, the redundancy power supplying can be realized by the two power supplying photovoltaic modules via the diodes Da and Db.

Figure 9:
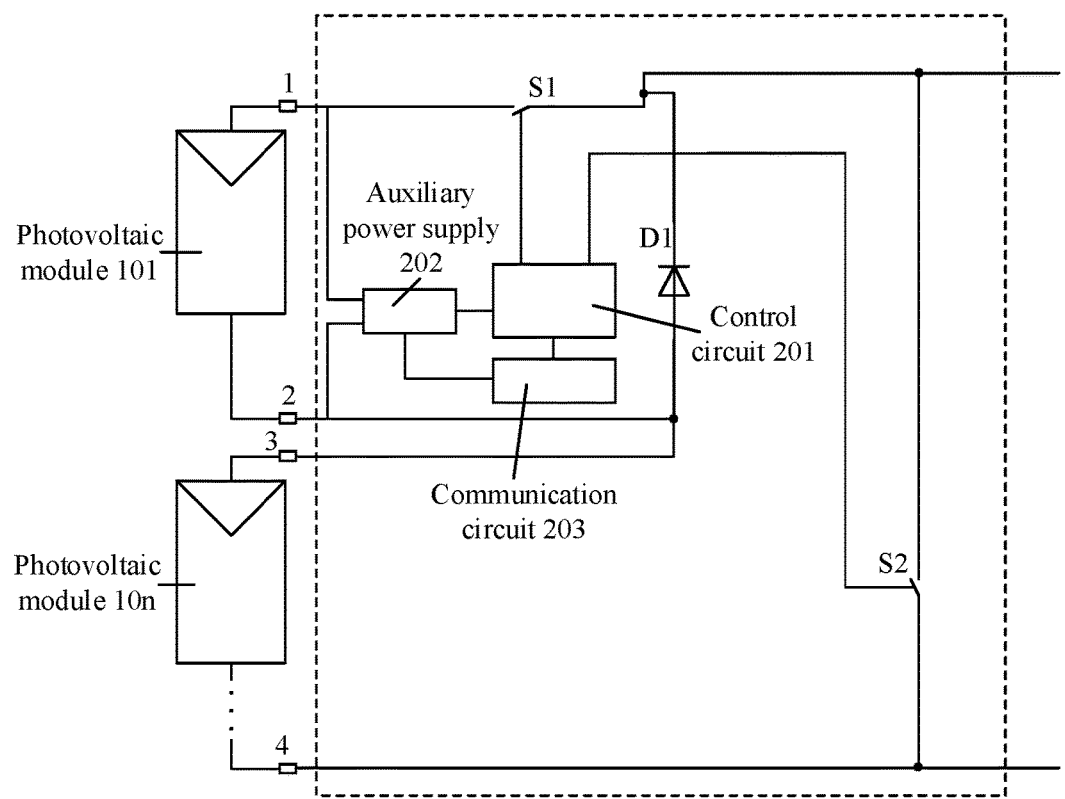
FIG. 9 is a schematic diagram showing another photovoltaic rapid shutdown device similar to that shown in FIG. 1 according to an embodiment of the present disclosure.

In addition, in the photovoltaic rapid shutdown device according to the above embodiments, the power supplying photovoltaic module is located at the lowermost position in a branch formed by multiple photovoltaic modules connected in series with each other. It should be understood that the power supplying photovoltaic module may be located at any position in the branch formed by the multiple photovoltaic modules connected in series with each other. For example, as shown in FIG. 9, a power supplying photovoltaic module 101 which is located at the uppermost position in the branch formed by the multiple photovoltaic modules supplies power to the auxiliary power supply 202. FIG. 9 differs from FIG. 1 only in that positions of the power supplying photovoltaic module are different. The operating principle of the embodiment shown in FIG. 9 is the same as that of FIG. 1, which is not repeated herein.

Figure 10:
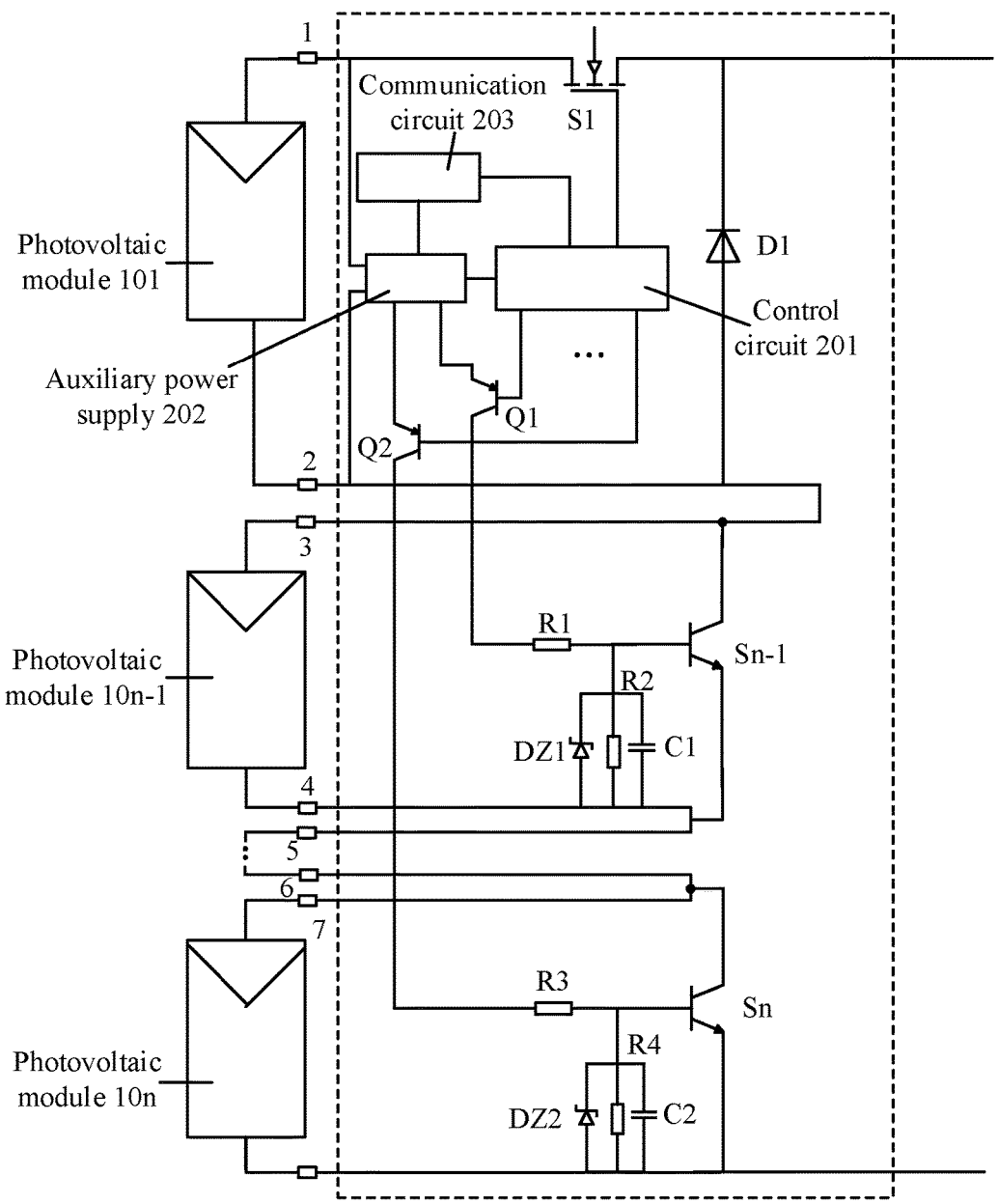
FIG. 10 is a schematic diagram of a photovoltaic rapid shutdown device according to an eighth embodiment of the present disclosure.

An implementation of the photovoltaic rapid shutdown device is described below by assuming that the short circuit switch and the open circuit switch are both semiconductor switches. Reference is made to FIG. 10, which is a schematic diagram of a photovoltaic rapid shutdown device according to an eighth embodiment of the present disclosure.

Except the position of the power supplying photovoltaic module, other structures are the same as in FIG. 10 and FIG. 5. That is, the power supplying photovoltaic module corresponds to an open circuit switch, and other photovoltaic modules correspond to short circuit switches.

In the above embodiments, if only one photovoltaic module supplies power to the auxiliary power supply, the power supplying photovoltaic module and the auxiliary power supply are driven to be non-common-grounded in the case that the semiconductor switch is adopted.

A driver circuit is provided in the embodiment. The driver circuit is configured to drive the short circuit switches in a case that the auxiliary power supply is an isolated power supply.

As shown in FIG. 10, a first driving transistor Q1 and a second driving transistor Q2 each are PNP transistors (or PMOS transistors), an open circuit switch S1 is an NMOS transistor, and short circuit switches Sn−1 to Sn are IGBTs. It should be understood that a triode, a MOS transistor and an IGBT are all semiconductor switches.

An emitter of each PNP transistor is connected to an output terminal of the auxiliary power supply 202, a base of the PNP transistor is connected to the control circuit 201, and a collector of the PNP transistor is connected to a resistor (i.e., a collector of the first driving transistor Q1 is connected to a resistor R1, and a collector of the second driving transistor Q2 is connected to a resistor R3. In addition, the other terminal of the resistor is connected to a gate of a short circuit switch (corresponding to an IGBT) and an RCD circuit. It should be noted that the RCD circuit is a snubber circuit.

In the normal operation, a driving signal of the first driving transistor Q1 is high, the first driving transistor Q1 is cut off, so that a transistor Sn−1 is pulled down, and the transistor Sn−1 is turned off. When a shutdown signal is received, the driving signal of the first driving transistor Q is low, the first driving transistor Q1 is turned on, so that a driving terminal of the transistor Sn−1 is clamped by a zener diode, the transistor Sn−1 is turned on, and the photovoltaic module 10n−1 is short-circuited, thereby realizing the protection. The operating principle of the second driving transistor Q2 is the same as that of the first driving transistor Q1, which is not repeated herein.

An implementation of the driving circuit in a case that a photovoltaic module located uppermost supplies power to the auxiliary power supply is shown in FIG. 10. An implementation of a driving circuit in a case that a photovoltaic module located lowermost supplies power to the auxiliary power supply is described below.

Figure 11:
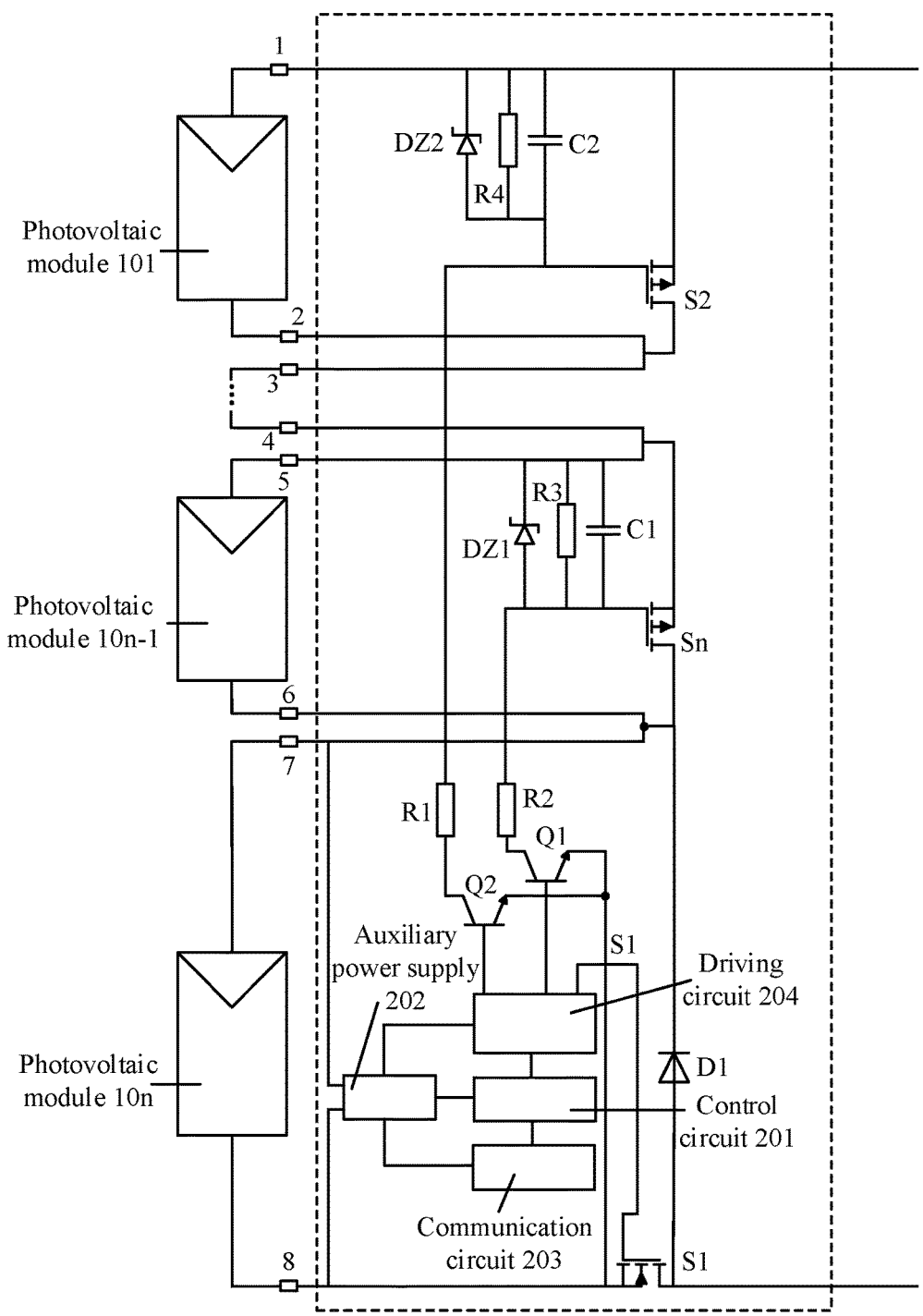
FIG. 11 is a schematic diagram of a photovoltaic rapid shutdown device according to a ninth embodiment of the present disclosure.

Reference is made to FIG. 11, which is a schematic diagram of a photovoltaic rapid shutdown device according to a ninth embodiment of the present disclosure.

In the present embodiment, a power supplying photovoltaic module 10n is located at a PV end.

An terminal of an open circuit switch S1 corresponding to the power supplying photovoltaic module 10n is connected to a negative output terminal of the power supplying photovoltaic module 10n, and the other terminal of the open circuit switch S1 is connected to an anode of an anti-parallel diode D1. In addition, a cathode of the diode D1 is connected to a positive output terminal of the power supplying photovoltaic module 10n. The open circuit switch S1 may be an NMOS transistor.

Short circuit switches corresponding to other photovoltaic modules may be PMOS transistors. In addition, each PMOS transistor is connected in parallel with an input port of the shutdown device. That is, each PMOS transistor is connected in parallel with an output terminal of the corresponding photovoltaic module. An RCD circuit is connected in parallel between a gate and a source of each PMOS transistor (in which D indicates a zener diode).

The transistor Q1 may be an NPN transistor (or an NMOS transistor), the open circuit switch S1 may be an NMOS transistor, and the short circuit switches S2 to Sn may be PMOS transistors. An emitter of the NPN transistor is connected to an output terminal of the auxiliary power supply 202, a base of the NPN transistor is connected to the control circuit 201, and a collector of the NPN transistor is connected to a resistor (such as a resistor R1 or R2 in the drawing). In addition, the other terminal of the resistor is connected to a gate of a short circuit switch (corresponding to an IGBT) and an RCD circuit.

It should be noted that the photovoltaic rapid shutdown device according to the present embodiment may further include a driving circuit 204 configured to drive the transistors Q1 and Q2 by amplifying the control signal transmitted from the control circuit 201.

Figure 12:
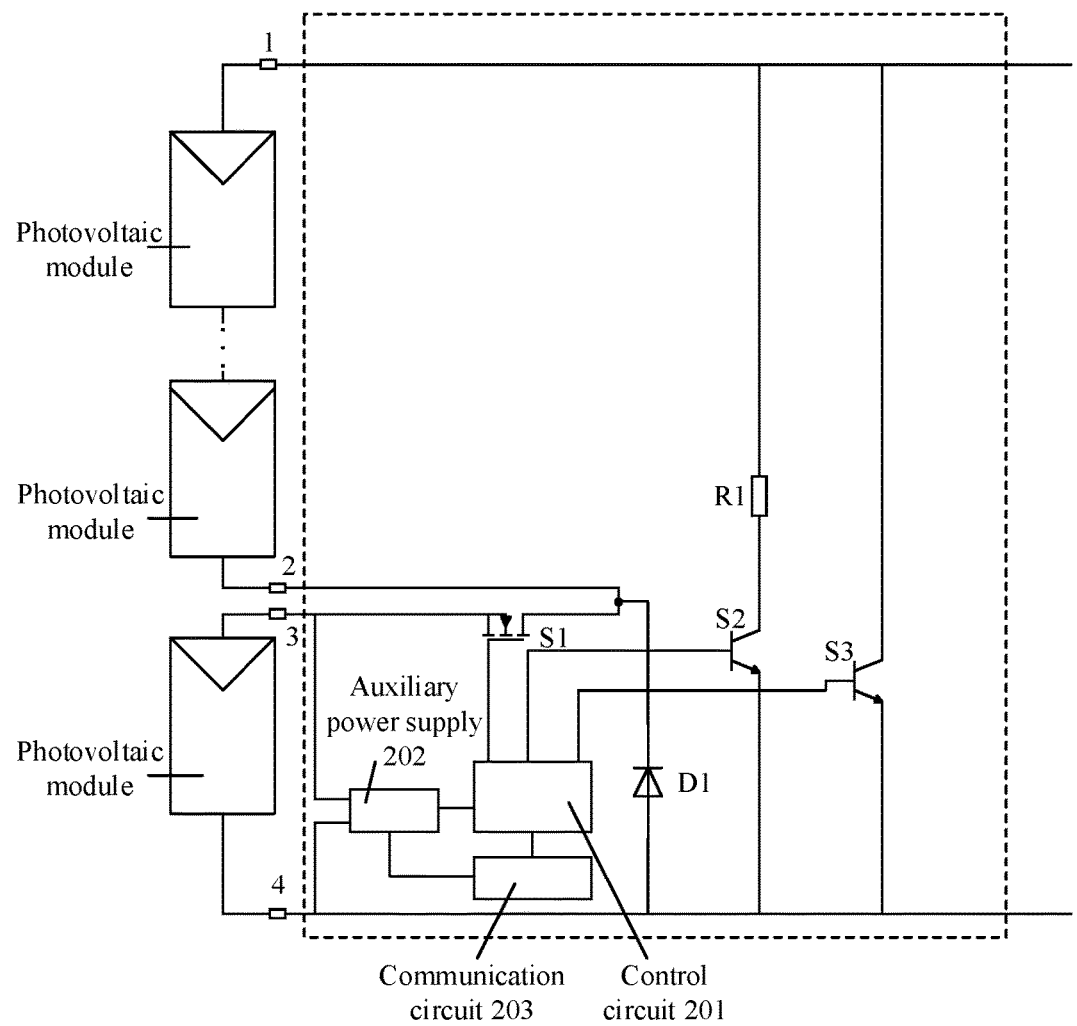
FIG. 12 is a circuit diagram showing an implementation of the photovoltaic rapid shutdown device shown in FIG. 3.

For the first embodiment and the second embodiment, in a case that the auxiliary power supply is an isolated power supply, a switch S1 may be a MOS transistor, as shown in FIG. 12. FIG. 12 shows an implementation of the photovoltaic rapid shutdown device of FIG. 3.

Switches S2 and the S3 may be implemented by semiconductor switches such as an IGBT, or mechanical switches such as a relay (no anti-parallel diode is required).

Figure 4:
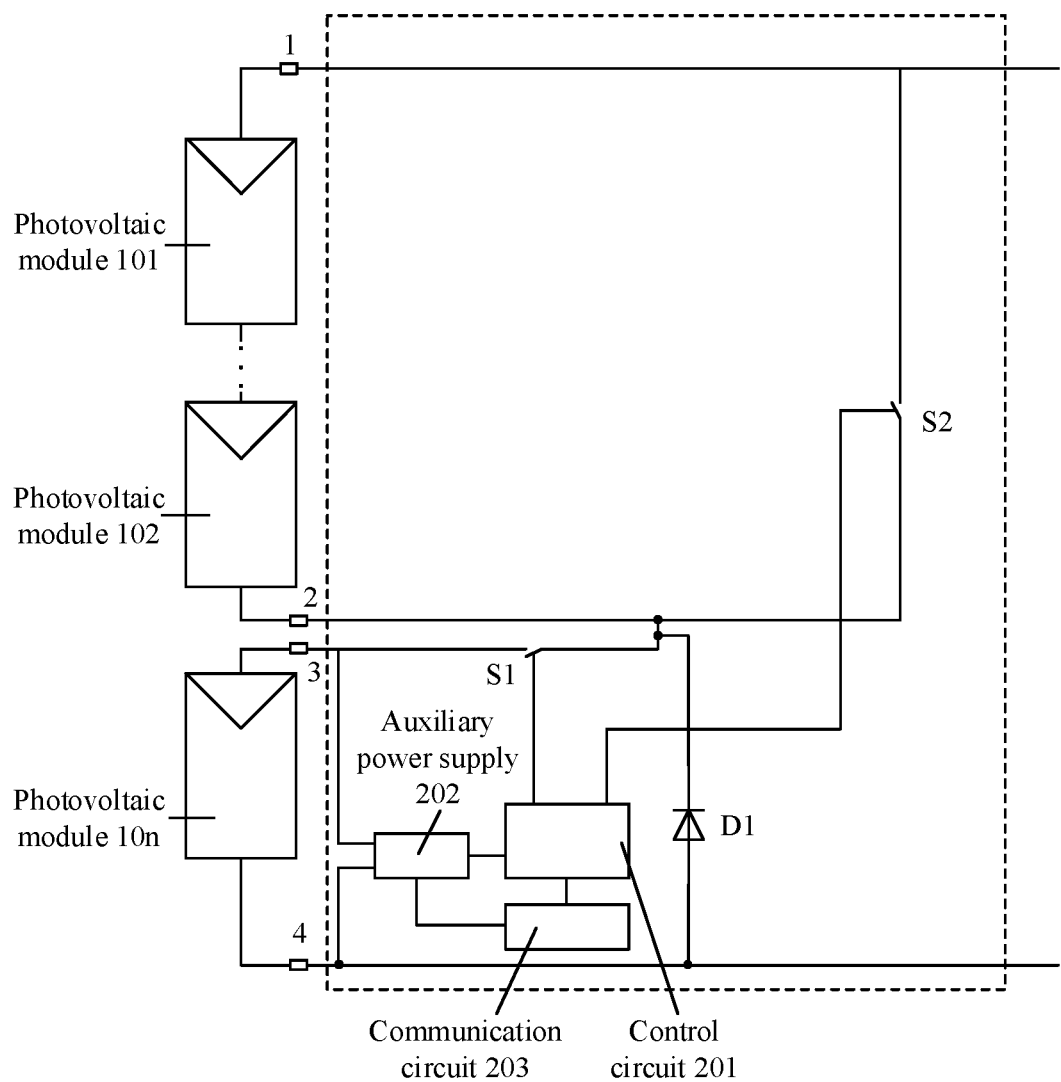
FIG. 4 is a schematic diagram of a photovoltaic rapid shutdown device according to a fourth embodiment of the present disclosure.
Figure 13:
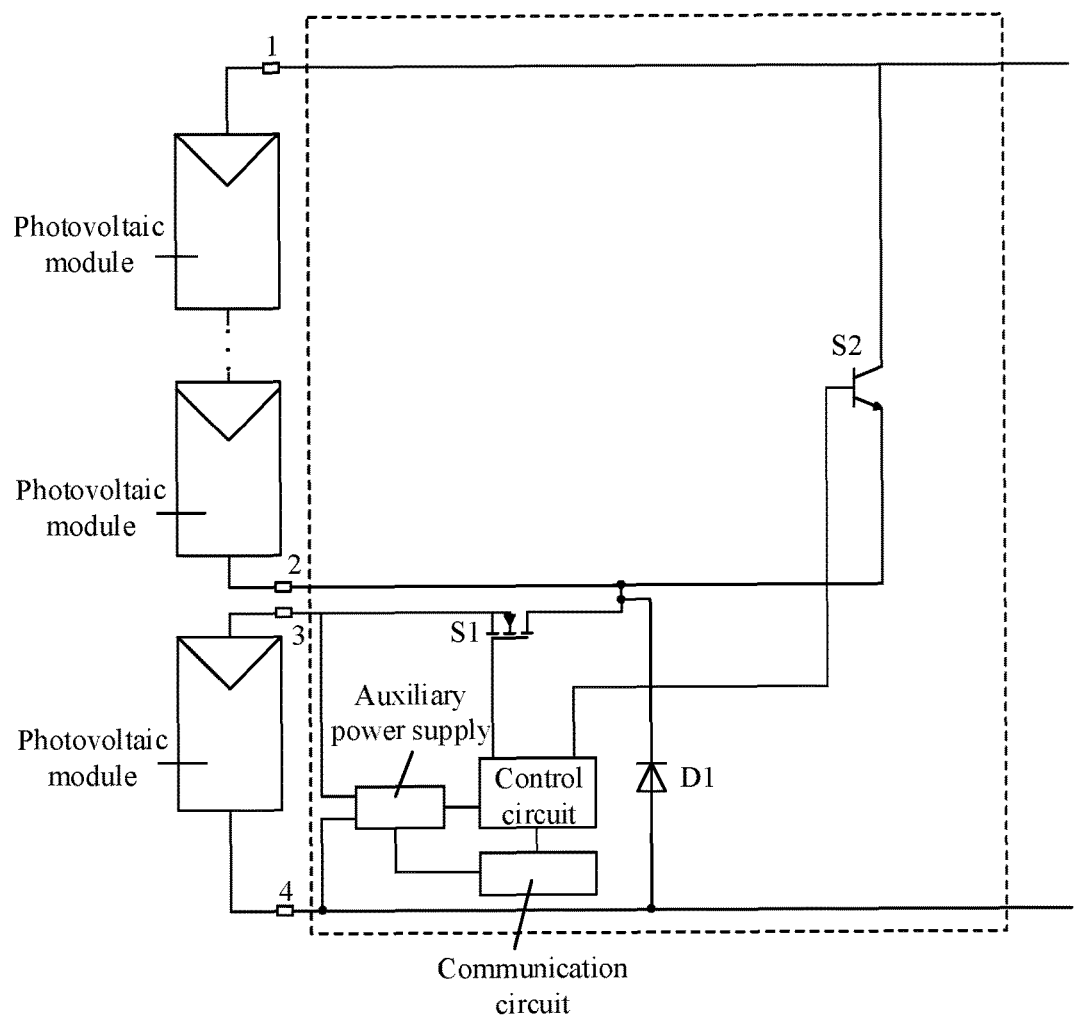
FIG. 13 is a circuit diagram showing an implementation of the photovoltaic rapid shutdown device shown in FIG. 4.

In addition, FIG. 13 shows an implementation of the photovoltaic rapid shutdown device of FIG. 4. In FIG. 13, the switch S1 is an NMOS transistor, and the switch S2 is an IGBT.

Figure 14:
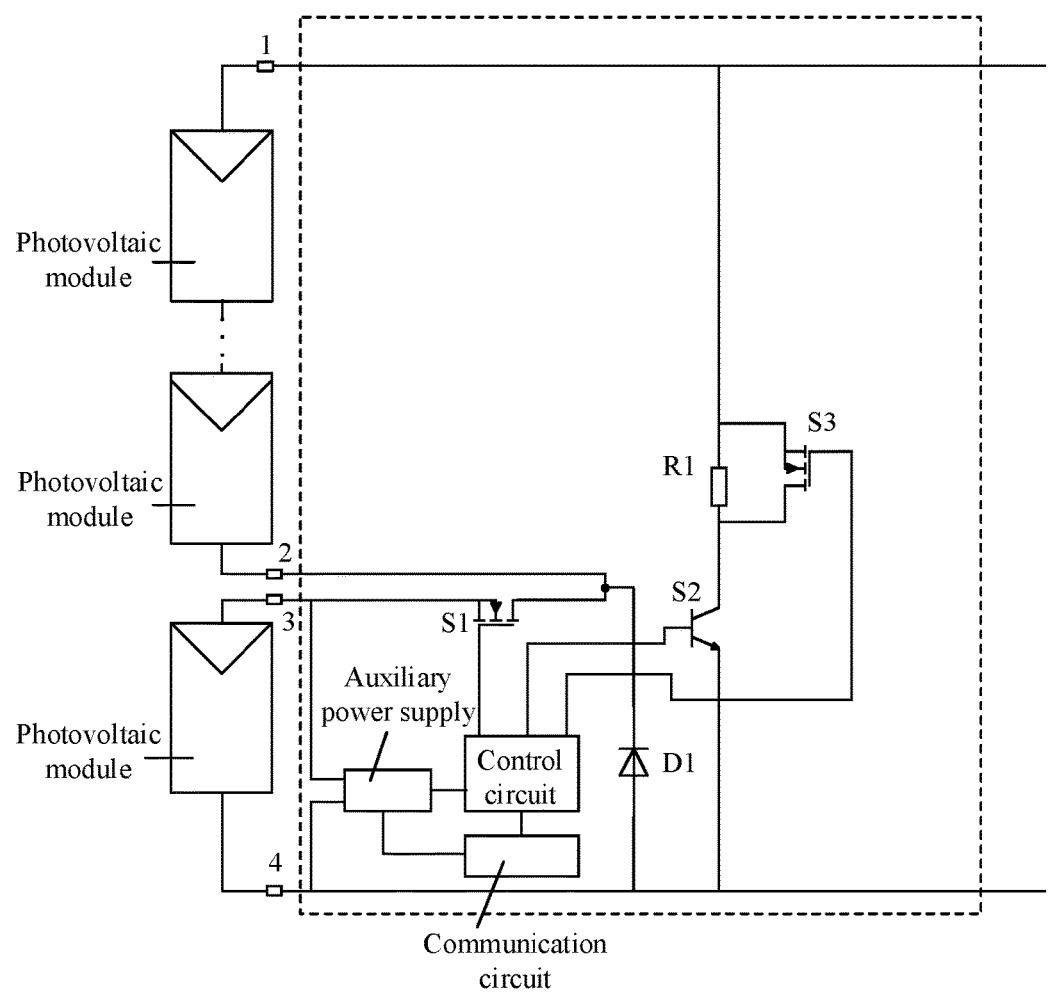
FIG. 14 is a circuit diagram showing an implementation of the photovoltaic rapid shutdown device shown in FIG. 5.

FIG. 14 shows an implementation of the photovoltaic rapid shutdown device of FIG. 5. In FIG. 14, the switch S1 is an NMOS transistor, the switch S2 is an IGBT, and the switch S3 is an NMOS transistor.

Based on the photovoltaic rapid shutdown device according to the above embodiment, a photovoltaic system is further provided in the disclosure, which is described below in detail in conjunction with the drawings.

Figure 15:
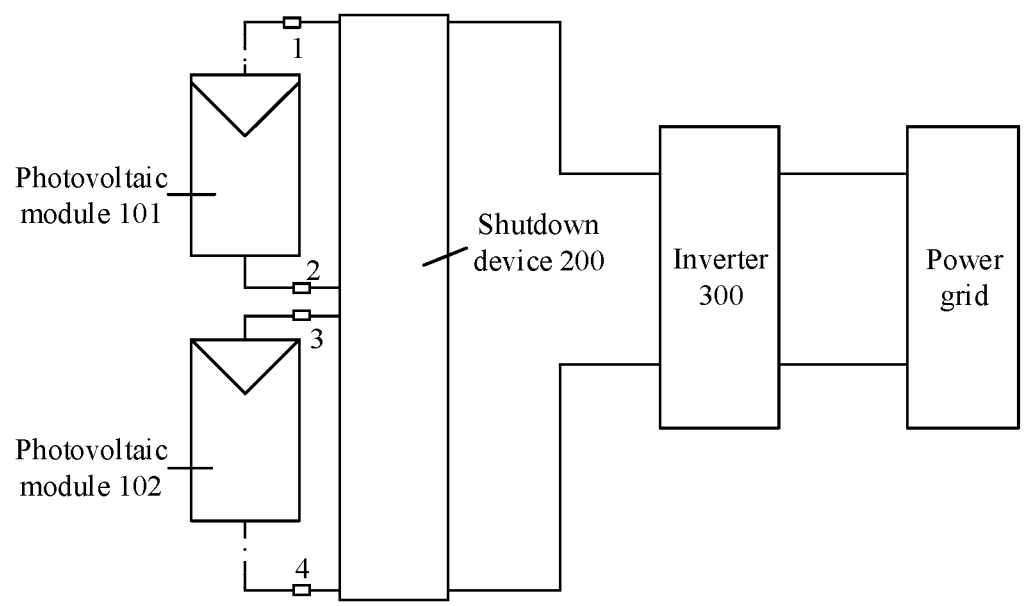
FIG. 15 is a schematic diagram of a photovoltaic system according to an embodiment of the present disclosure.

Reference is made to FIG. 15, which is a schematic diagram of a photovoltaic system according to an embodiment of the present disclosure.

The photovoltaic system according to the present embodiment includes the photovoltaic rapid shutdown device 200 according to the above embodiment, an inverter 300, and the photovoltaic module 101 and the photovoltaic module 102 shown in FIG. 1. It should be noted that the photovoltaic module 101 may be multiple photovoltaic modules connected in series with each other.

The photovoltaic rapid shutdown device 200 includes at least two input ports, such as an input port 1-2 and an input port 3-4 shown in FIG. 15.

The photovoltaic module 102 which supplies power to the photovoltaic rapid shutdown device 200 serves as a power supplying photovoltaic module. An output terminal of the power supplying photovoltaic module 102 is connected to one of the at least two input ports and other photovoltaic modules are connected to other input ports.

The output port of the photovoltaic rapid shutdown device 200 is connected to an input terminal of the inverter 300.

The inverter 300 is configured to transmit a control signal to the photovoltaic rapid shutdown device 200.

The photovoltaic rapid shutdown device 200 is configured to shut down the photovoltaic module when receiving the control signal.

In addition, a transformer may be arranged between the inverter 300 and a power grid. The transformer is configured to match an output voltage of the inverter with a power grid voltage and isolate the inverter 300 from the power grid.

Since the photovoltaic system according to the present embodiment includes the photovoltaic rapid shutdown device according to the above embodiment, and the shutdown device includes only one control circuit, one auxiliary power supply and one communication circuit, the control circuit can control the shutdown of all of the photovoltaic modules, and thus the whole shutdown device has a simplified structure. In addition, the shutdown device includes at least one short circuit switch, and no current flows through the short circuit switch in the normal operation, so that the power consumption of the whole photovoltaic system can be reduced.

Figure 16:
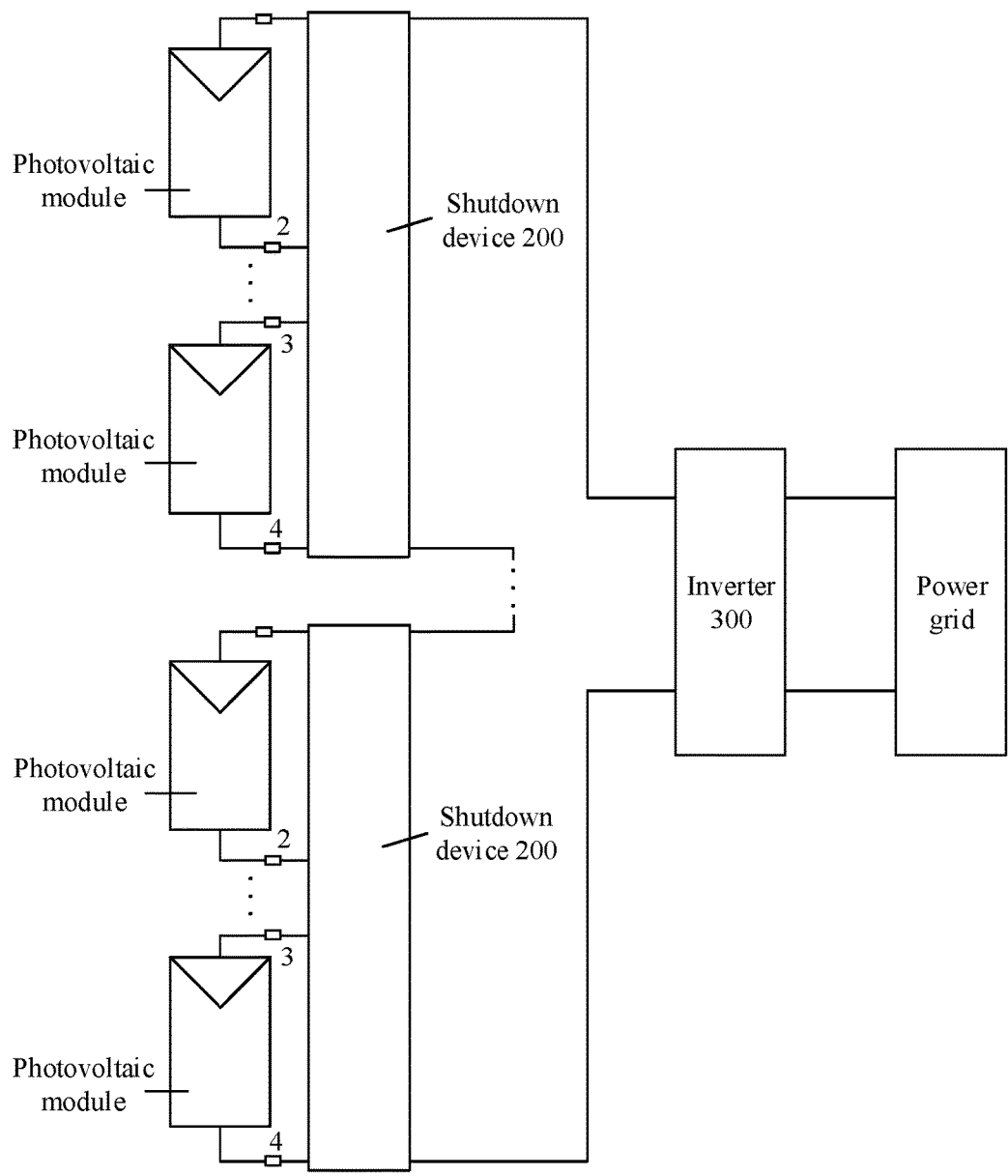
FIG. 16 is a schematic diagram of a photovoltaic system according to another embodiment of the present disclosure.

Reference is made to FIG. 16, which is a schematic diagram of a photovoltaic system according to another embodiment of the present disclosure.

The photovoltaic system according to the present embodiment includes the photovoltaic rapid shutdown devices 200 according to the above embodiments and an inverter 300.

The number of the photovoltaic rapid shutdown devices 200 is at least two.

An input terminal of each photovoltaic rapid shutdown device 200 is connected to the photovoltaic module, and output terminals of all of the photovoltaic rapid shutdown devices are connected in series with each other to be connected to an input terminal of the inverter 300.

The inverter 300 is configured to transmit a control signal to the photovoltaic rapid shutdown device 200.

The photovoltaic rapid shutdown device 200 is configured to shut down the corresponding photovoltaic module when receiving the control signal.

It should be noted that, since all of the photovoltaic modules are shut down during the photovoltaic module shutdown process, the inverter 300 transmits the control signal to all of the photovoltaic rapid shutdown devices.

In addition, a current combiner device may be arranged between the photovoltaic rapid shutdown devices 200 and the inverter 300. Output currents of multiple photovoltaic rapid shutdown devices 200 may be converged by the current combiner device and the converged current flows into the input terminal of the inverter.

In addition, a transformer may be arranged between the inverter 300 and a power grid. The transformer is configured to match an output voltage of the inverter with a power grid voltage and isolate the inverter 300 from the power grid.

Since the photovoltaic system according to the present embodiment includes the photovoltaic rapid shutdown device according to the above embodiment, and the shutdown device includes only one control circuit, one auxiliary power supply and one communication circuit, the control circuit can control the shutdown of all of the photovoltaic modules, and thus the whole shutdown device has a simplified structure. In addition, the shutdown device includes at least one short circuit switch, and no current flows through the short circuit switch in the normal operation, so that the power consumption of the whole photovoltaic system can be reduced.

The foregoing embodiments are only preferred embodiments of the disclosure and are not intended to limit the disclosure. The preferred embodiments according to the disclosure are disclosed above, and are not intended to limit the disclosure. Those skilled in the art may make, based on the disclosed method and technical content, some variations and improvements on the technical solutions of the disclosure, or make some equivalent variations on the embodiments without departing from the scope of the technical solutions of the present disclosure. All simple modifications, equivalent variations and improvements made based on the technical essence of the present disclosure without departing from the content of the technical solution of the present disclosure fall in the protection scope of the technical solutions of the disclosure.

The invention claimed is:

1. A photovoltaic rapid shutdown device, applied to a photovoltaic system, wherein the photovoltaic system comprises a plurality of photovoltaic modules connected in series with each other, and the photovoltaic rapid shutdown device comprises:
   a first switch,
   a second switch,
   a bypass diode,
   an auxiliary power supply,
   a control circuit, and
   a communication circuit, wherein
   one of the plurality of photovoltaic modules serves as a power supplying photovoltaic module, and an output terminal of the power supplying photovoltaic module is connected to an input terminal of the auxiliary power supply;
   the first switch is connected in series between the power supplying photovoltaic module and an adjacent photovoltaic module of the power supplying photovoltaic module;
   two terminals of the second switch are connected to a positive output terminal and a negative output terminal of a branch formed by the plurality of photovoltaic modules connected in series with each other, respectively;
   a cathode of the bypass diode is connected to a low voltage terminal of the adjacent photovoltaic module of the power supplying photovoltaic module, and an anode of the bypass diode is connected to a low voltage terminal of the power supplying photovoltaic module;
   the communication circuit is configured to receive a shutdown instruction transmitted from outside and transmit the shutdown instruction to the control circuit; and
   the control circuit is configured to control the first switch to be turned off and the second switch to be turned on when receiving the shutdown instruction.

2. The photovoltaic rapid shutdown device according to claim 1, further comprising:
   a current limiting resistor, and
   a third switch, wherein
   the current limiting resistor is connected in series with the third switch to form a branch, and the branch is connected in parallel with the second switch; and
   the control circuit is configured to firstly control the first switch to be turned off and the third switch to be turned on when receiving the shutdown instruction, and then control the second switch to be turned on when detecting that a bus voltage reduces to a voltage lower than a predetermined voltage.

3. The photovoltaic rapid shutdown device according to claim 1, further comprising:
   a current limiting resistor, and
   a third switch, wherein
   the current limiting resistor is connected in series with the second switch;
   the third switch is connected in parallel with the current limiting resistor; and
   the control circuit is configured to firstly control the first switch to be turned off and the second switch to be turned on when receiving the shutdown instruction, and then control the third switch to be turned on when detecting that a bus voltage reduces to a voltage lower than a predetermined voltage.

4. A photovoltaic rapid shutdown device, applied to a photovoltaic system, wherein the photovoltaic system comprises a plurality of photovoltaic modules connected in series with each other, and the photovoltaic rapid shutdown device comprises:
   a first switch,
   one or more second switches,
   a bypass diode,
   an auxiliary power supply,
   a control circuit, and
   a communication circuit, wherein
   one of the plurality of photovoltaic modules serves as a power supplying photovoltaic module, and an output terminal of the power supplying photovoltaic module is connected to an input terminal of the auxiliary power supply;
   the first switch is connected in series between the power supplying photovoltaic module and an adjacent photovoltaic module of the power supplying photovoltaic module;
   in the case of one second switch, the second switch is connected between a positive output terminal and a negative output terminal of a branch formed by photovoltaic modules among the plurality of photovoltaic modules other than the power supplying photovoltaic module connected in series with each other;
   in the case of more than one second switch, each of the second switches corresponds to one or more photovoltaic modules among the plurality of photovoltaic modules other than the power supplying photovoltaic module, and each of the second switches is connected in parallel with an output terminal of the corresponding photovoltaic module;
   a cathode of the bypass diode is connected to a low voltage terminal of the adjacent photovoltaic module of the power supplying photovoltaic module, and an anode of the bypass diode is connected to a low voltage terminal of the power supplying photovoltaic module;
   the communication circuit is configured to receive a shutdown instruction transmitted from outside and transmit the shutdown instruction to the control circuit; and
   the control circuit is configured to control the first switch to be turned off and the second switch to be turned on when receiving the shutdown instruction.

5. A photovoltaic rapid shutdown device, applied to a photovoltaic system, wherein the photovoltaic system comprises a plurality of photovoltaic modules connected in series with each other, and the photovoltaic rapid shutdown device comprises:

a first switch,
a second switch,
a first bypass diode,
a second bypass diode,
an auxiliary power supply,
a control circuit,
a communication circuit, and
one or more short circuit switches, wherein
the plurality of photovoltaic modules comprise a first power supplying photovoltaic module and a second power supplying photovoltaic module;
the first switch is connected in series between the first power supplying photovoltaic module and an adjacent photovoltaic module of the first power supplying photovoltaic module;
the second switch is connected in series between the second power supplying photovoltaic module and an adjacent photovoltaic module of the second power supplying photovoltaic module;
each of the short circuit switches corresponds to one or more photovoltaic modules among the plurality of photovoltaic modules other than the first and second power supplying photovoltaic modules, and each of short circuit switches is connected in parallel with an output terminal of the corresponding photovoltaic module;
a cathode of the first bypass diode is connected to a low voltage terminal of the adjacent photovoltaic module of the first power supplying photovoltaic module, an anode of the first bypass diode is connected to a low voltage terminal of the first power supplying photovoltaic module, a cathode of the second bypass diode is connected to a low voltage terminal of the adjacent photovoltaic module of the second power supplying photovoltaic module, and an anode of the second bypass diode is connected to a low voltage terminal of the second power supplying photovoltaic module;
the communication circuit is configured to receive a shutdown instruction transmitted from outside and transmit the shutdown instruction to the control circuit; and
the control circuit is configured to control the first switch to be turned off, the second switch to be turned off, and all of the short circuit switches to be turned on when receiving the shutdown instruction.

6. The photovoltaic rapid shutdown device according to claim 5, further comprising:
a first power supplying diode, and
a second power supplying diode, wherein
an anode of the first power supplying diode is connected to a high voltage terminal of the first power supplying photovoltaic module, and a cathode of the first power supplying diode is connected to the input terminal of the auxiliary power supply; and
an anode of the second power supplying diode is connected to a high voltage terminal of the second power supplying photovoltaic module, and a cathode of the second power supplying diode is connected to the input terminal of the auxiliary power supply.

7. The photovoltaic rapid shutdown device according to claim 5, wherein the first switch, the second switch and the open circuit switch each are any one of a triode, a Metal Oxide Semiconductor (MOS) transistor, an Insulated Gate bipolar Transistor (IGBT) or a relay.

8. The photovoltaic rapid shutdown device according to claim 6, wherein the first switch, the second switch and the open circuit switch each are any one of a triode, a Metal Oxide Semiconductor (MOS) transistor, an Insulated Gate bipolar Transistor (IGBT) or a relay.

9. A photovoltaic system, comprising:
the photovoltaic rapid shutdown device according to claim 1,
an inverter, and
a plurality of photovoltaic modules, wherein
the photovoltaic rapid shutdown device comprises at least two input ports;
one of the plurality of photovoltaic modules, which supplies power to the photovoltaic rapid shutdown device, serves as a power supplying photovoltaic module, wherein an output terminal of the power supplying photovoltaic module is connected to one of the at least two input ports, and other photovoltaic modules are connected to other input ports;
an output port of the photovoltaic rapid shutdown device is connected to an input terminal of the inverter;
the inverter is configured to transmit a control signal to the photovoltaic rapid shutdown device; and
the photovoltaic rapid shutdown device is configured to shut down the photovoltaic module when receiving the control signal.

10. A photovoltaic system, comprising:
the photovoltaic rapid shutdown device according to claim 4,
an inverter, and
a plurality of photovoltaic modules, wherein
the photovoltaic rapid shutdown device comprises at least two input ports;
one of the plurality of photovoltaic modules, which supplies power to the photovoltaic rapid shutdown device, serves as a power supplying photovoltaic module, wherein an output terminal of the power supplying photovoltaic module is connected to one of the at least two input ports, and other photovoltaic modules are connected to other input ports;
an output port of the photovoltaic rapid shutdown device is connected to an input terminal of the inverter;
the inverter is configured to transmit a control signal to the photovoltaic rapid shutdown device; and
the photovoltaic rapid shutdown device is configured to shut down the photovoltaic module when receiving the control signal.

11. A photovoltaic system, comprising:
the photovoltaic rapid shutdown device according to claim 5,
an inverter, and
a plurality of photovoltaic modules, wherein
the photovoltaic rapid shutdown device comprises at least two input ports;
one of the plurality of photovoltaic modules, which supplies power to the photovoltaic rapid shutdown device, serves as a power supplying photovoltaic module, wherein an output terminal of the power supplying photovoltaic module is connected to one of the at least two input ports, and other photovoltaic modules are connected to other input ports;
an output port of the photovoltaic rapid shutdown device is connected to an input terminal of the inverter;
the inverter is configured to transmit a control signal to the photovoltaic rapid shutdown device; and
the photovoltaic rapid shutdown device is configured to shut down the photovoltaic module when receiving the control signal.

12. A photovoltaic system, comprising:
the photovoltaic rapid shutdown devices according to claim 1, and
an inverter, wherein
the number of the photovoltaic rapid shutdown devices is at least two;
an input terminal of each of the photovoltaic rapid shutdown devices is connected to the photovoltaic module, and output terminals of all of the photovoltaic rapid shutdown devices are connected in series with each other to be connected to an input terminal of the inverter;
the inverter is configured to transmit a control signal to the photovoltaic rapid shutdown device; and
the photovoltaic rapid shutdown device is configured to shut down the corresponding photovoltaic module when receiving the control signal.

13. A photovoltaic system, comprising:
the photovoltaic rapid shutdown devices according to claim 4, and
an inverter, wherein
the number of the photovoltaic rapid shutdown devices is at least two;
an input terminal of each of the photovoltaic rapid shutdown devices is connected to the photovoltaic module, and output terminals of all of the photovoltaic rapid shutdown devices are connected in series with each other to be connected to an input terminal of the inverter;
the inverter is configured to transmit a control signal to the photovoltaic rapid shutdown device; and
the photovoltaic rapid shutdown device is configured to shut down the corresponding photovoltaic module when receiving the control signal.

14. A photovoltaic system, comprising:
the photovoltaic rapid shutdown devices according to claim 5, and
an inverter, wherein
the number of the photovoltaic rapid shutdown devices is at least two;
an input terminal of each of the photovoltaic rapid shutdown devices is connected to the photovoltaic module, and output terminals of all of the photovoltaic rapid shutdown devices are connected in series with each other to be connected to an input terminal of the inverter;
the inverter is configured to transmit a control signal to the photovoltaic rapid shutdown device; and
the photovoltaic rapid shutdown device is configured to shut down the corresponding photovoltaic module when receiving the control signal.

15. The photovoltaic system according to claim 12, further comprising at least one of:
a combiner box connected between the photovoltaic rapid shutdown device and the inverter; and
a transformer connected between the inverter and a power grid.

* * * * *